(12) United States Patent
Cheng

(10) Patent No.: US 6,779,005 B2
(45) Date of Patent: Aug. 17, 2004

(54) METHOD AND DEVICE FOR DETECTING RANDOM MISSING CODE

(75) Inventor: Yi-Jen Cheng, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 615 days.

(21) Appl. No.: 09/876,824

(22) Filed: Jun. 7, 2001

(65) Prior Publication Data
US 2002/0091743 A1 Jul. 11, 2002

(30) Foreign Application Priority Data
Jan. 9, 2001 (TW) ........................................ 90100461 A

(51) Int. Cl.[7] .................................................. G06J 1/00
(52) U.S. Cl. ........................................... 708/3; 341/143
(58) Field of Search .............................. 708/3; 341/143, 341/155, 158

(56) References Cited

U.S. PATENT DOCUMENTS

| | | | | | |
|---|---|---|---|---|---|
| 3,859,654 A | * | 1/1975 | Harrison et al. | ............ | 341/141 |
| 5,051,799 A | * | 9/1991 | Paul et al. | .................. | 375/242 |
| 6,587,062 B1 | * | 7/2003 | Reinhold et al. | ........... | 341/143 |
| 2001/0033240 A1 | * | 10/2001 | Ueno et al. | .................. | 341/143 |

* cited by examiner

Primary Examiner—Tan V. Mai
(74) Attorney, Agent, or Firm—Allen, Dyer, Doppelt, Milbrath & Gilchrist, P.A.

(57) ABSTRACT

A method for detecting a random missing code by applying a delta-sigma ($\Delta\Sigma$) analog digital converter having a digital filter is provided. The method includes steps of floating an input end of the delta-sigma ($\Delta\Sigma$) analog digital converter, and detecting an output code outputted from the digital filter of the delta-sigma ($\Delta\Sigma$) analog digital converter for determining whether the random missing code exists. A detecting device for detecting the random missing code is also provided.

15 Claims, 10 Drawing Sheets

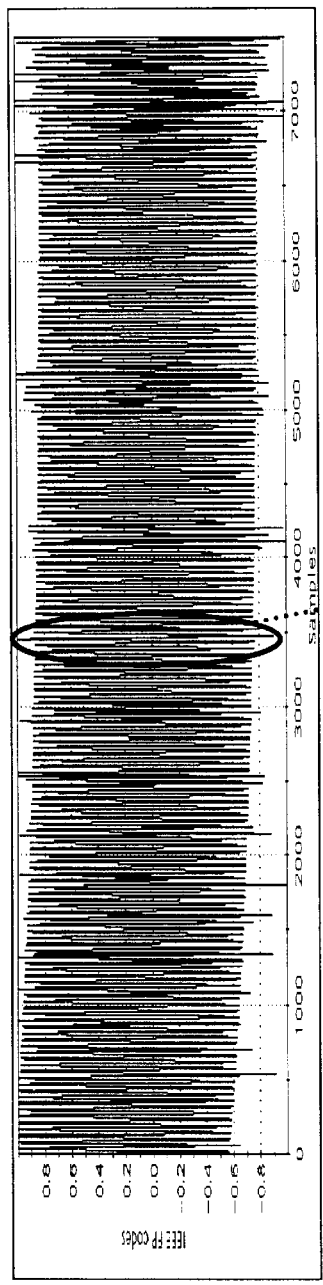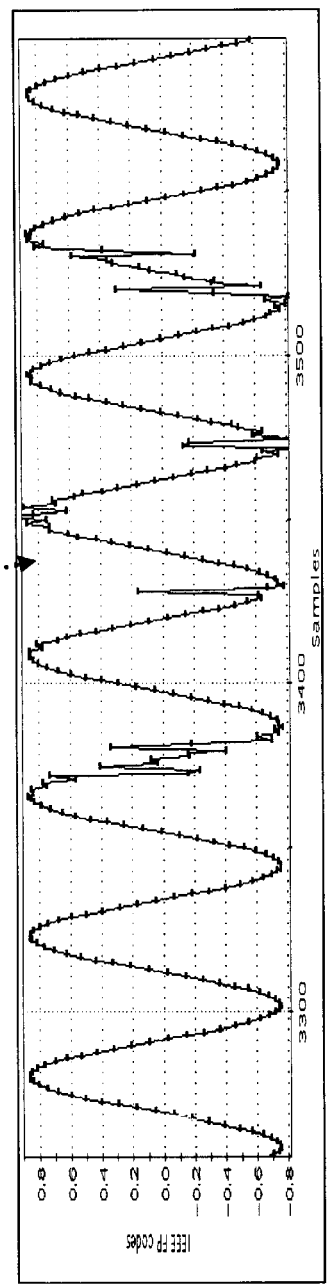
Fig. 3A (PRIOR ART)
Fig. 3B (PRIOR ART)

*Input sine wave*

*Input floating*

*Input sine wave*

*Input floating*

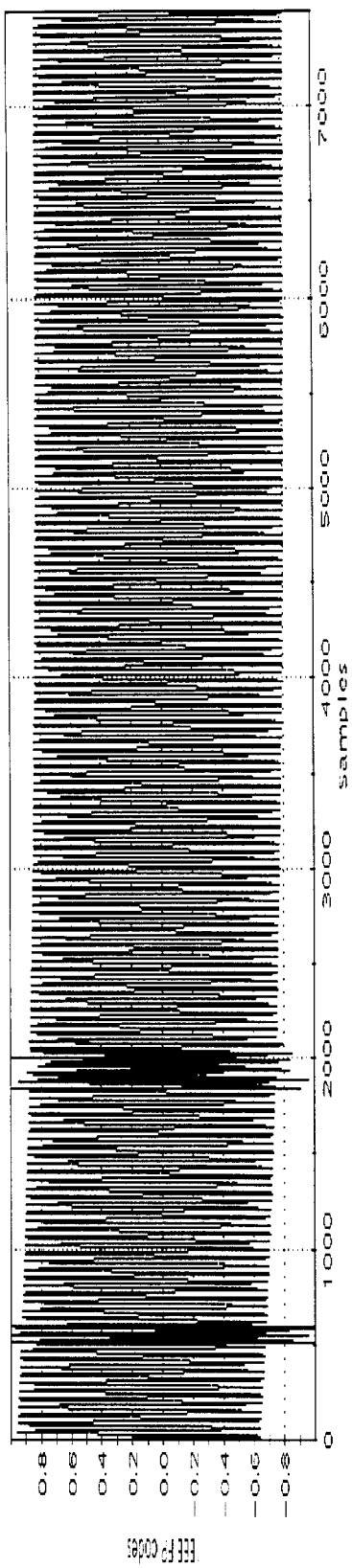
Fig. 8A *Input sine wave*
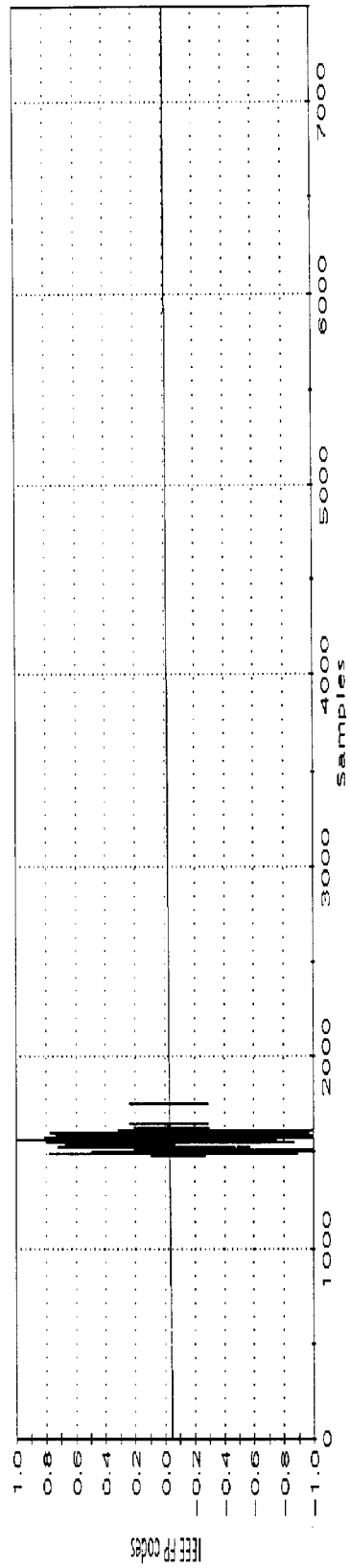
Fig. 8B *Input floating*

METHOD AND DEVICE FOR DETECTING RANDOM MISSING CODE

FIELD OF THE INVENTION

The present invention relates to a method and a device for detecting a random missing code, and more particularly to a method and a device for detecting a random missing code by applying a delta-sigma (ΔΣ) analog digital converter.

BACKGROUND OF THE INVENTION

Generally, the performance of an analog digital converter (ADC) is determined by the gauge such as a linearity, a dynamic range, a signal noise ratio (SNR) and the total harmonic distortion plus noise (THD+N). For example, the performance for the integrated circuit (IC) used in the audio coder/decoder (CODEC) is determined by the SNR value, i.e. the real efficient bit of the analog digital converter in a standard testing condition. Moreover, the transformation from a time domain to a frequency domain, i.e. Fourier Transforms, is implemented by the Fast Fourier Transforms (FFT) and the signal noise ratio (SNR) value is determined by a tester according to sampling points and a sampling period, as shown in FIGS. 1A, 1B and 1C.

When a random missing code exists in a chip, the random missing code could not be observed by the foregoing FFT method as shown in FIGS. 2A, 3A and 4A. The random missing code could be observed by magnifying partial sampling period in FIGS. 2A, 3A and 4A, as shown in FIGS. 2B, 3B and 4B. However, the random missing code randomly exists and could not be anticipated, so that the tester would be placed in error.

According to the above-mentioned description, the conventional measuring method has several drawbacks as follows:

1. The random missing code could not be anticipated and the sampling points and periods are limited when the tester is placed in error
2. The conventional measuring method, e.g. the Fast Fourier Transforms (FFT) is time-consuming.

It is therefore tried by the applicant to deal with the above situation encountered in the prior art.

SUMMARY OF THE INVENTION

It is therefore an object of the present invention to provide a method and a detecting device for detecting a random missing code rapidly.

According to an aspect of the present invention, the method for detecting a random missing code by applying a delta-sigma (ΔΣ) analog digital converter having a digital filter is provided. The method includes steps of floating an input end of the delta-sigma (ΔΣ) analog digital converter, and detecting an output code outputted from the digital filter of the delta-sigma (ΔΣ) analog digital converter for determining whether the random missing code exists.

Preferably, the random missing code is determined in a time domain.

Preferably, the random missing code is determined via an oscilloscope.

Preferably, the random missing code is determined by the value of the output code when floating the input end of the delta-sigma (ΔΣ) analog digital converter.

Preferably, the random missing code is determined when the value of the output code is a digital value other than 0.

Preferably, the delta-sigma (ΔΣ) analog digital converter further comprises a comparator, a digital analog converter and a low pass filter.

Preferably, the digital filter comprises a plurality of multiplier-accumulators, a delay flip-flop and a coefficient register.

According to another aspect of the present invention, the method for detecting a random missing code is provided. The method includes steps of providing a delta-sigma (ΔΣ) analog digital converter, floating an input end of the delta-sigma (ΔΣ) analog digital converter, and detecting an output code outputted from a digital filter of the delta-sigma (ΔΣ) analog digital converter for determining whether the value of the output code is a specific digital value other than 0.

Preferably, the random missing code is determined by the specific digital value other than 0.

According to another aspect of the present invention, the detecting device for detecting a random missing code includes an amplifier having an input end and an output end, wherein the input end is floating, an adder-subtractor electrically connected to the output end of the amplifier, a low pass filter electrically connected to the adder-subtractor, a comparator electrically connected to the low pass filter, a digital analog converter electrically connected to the comparator and the adder-subtractor, and a digital filter electrically connected to the comparator for outputting an output code, thereby determining whether the output code is the random missing code Preferably, the digital filter comprises a plurality of multiplier-accumulators, a delay flip-flop and a coefficient register.

Preferably, the random missing code is determined by the value of the output code.

Preferably, the random missing code is determined when the value of the output code is a digital value other than 0.

The present invention may best be understood through the following descriptions with reference to the accompanying drawings, in which:

BRIEF DESCRIPTION OF THE DRAWINGS

FIGS. 2A, 3A and 4A are signal spectrums measured by the tester according to the prior art;

FIGS. 2B, 3B and 4B are signal spectrums by magnifying partial sampling period in FIGS. 2A, 3A and 4A;

FIGS. 6A, 7A and 8A are signal spectrums measured by a tester according to a preferred embodiment of the present invention; and FIGS. 6B, 7B and 8B are diagrams illustrating a random missing code measured by the tester in FIGS. 6A, 7A and 8A.

DETAILED DESCRIPTION OF THE PREFERRED EMBODIMENTS

Figure 1A:
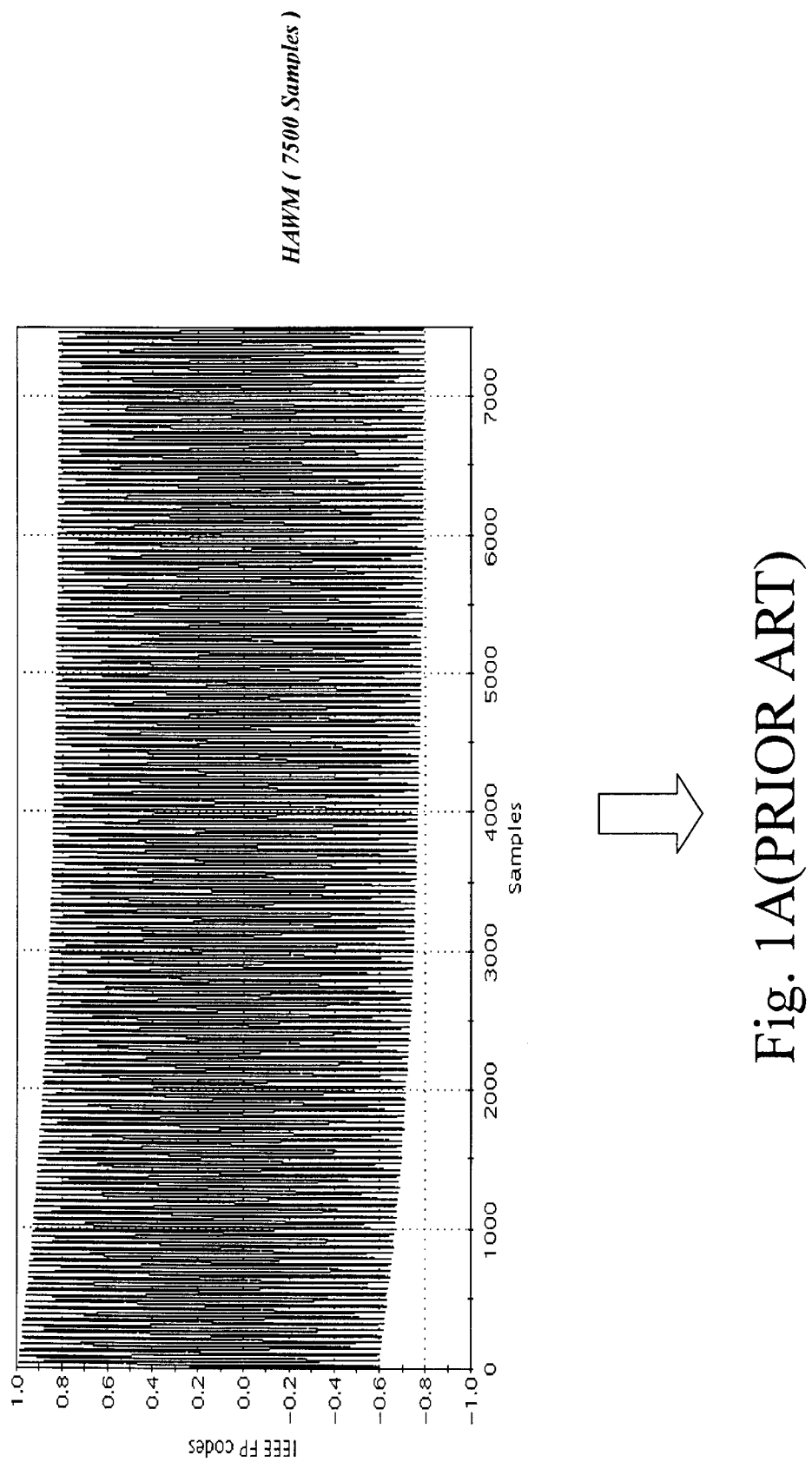
FIGS. 1A, 1B and 1C are schematic views showing a measuring method of the Fast Fourier Transforms (FFT) for a tester according to the prior art.
Figure 1B:
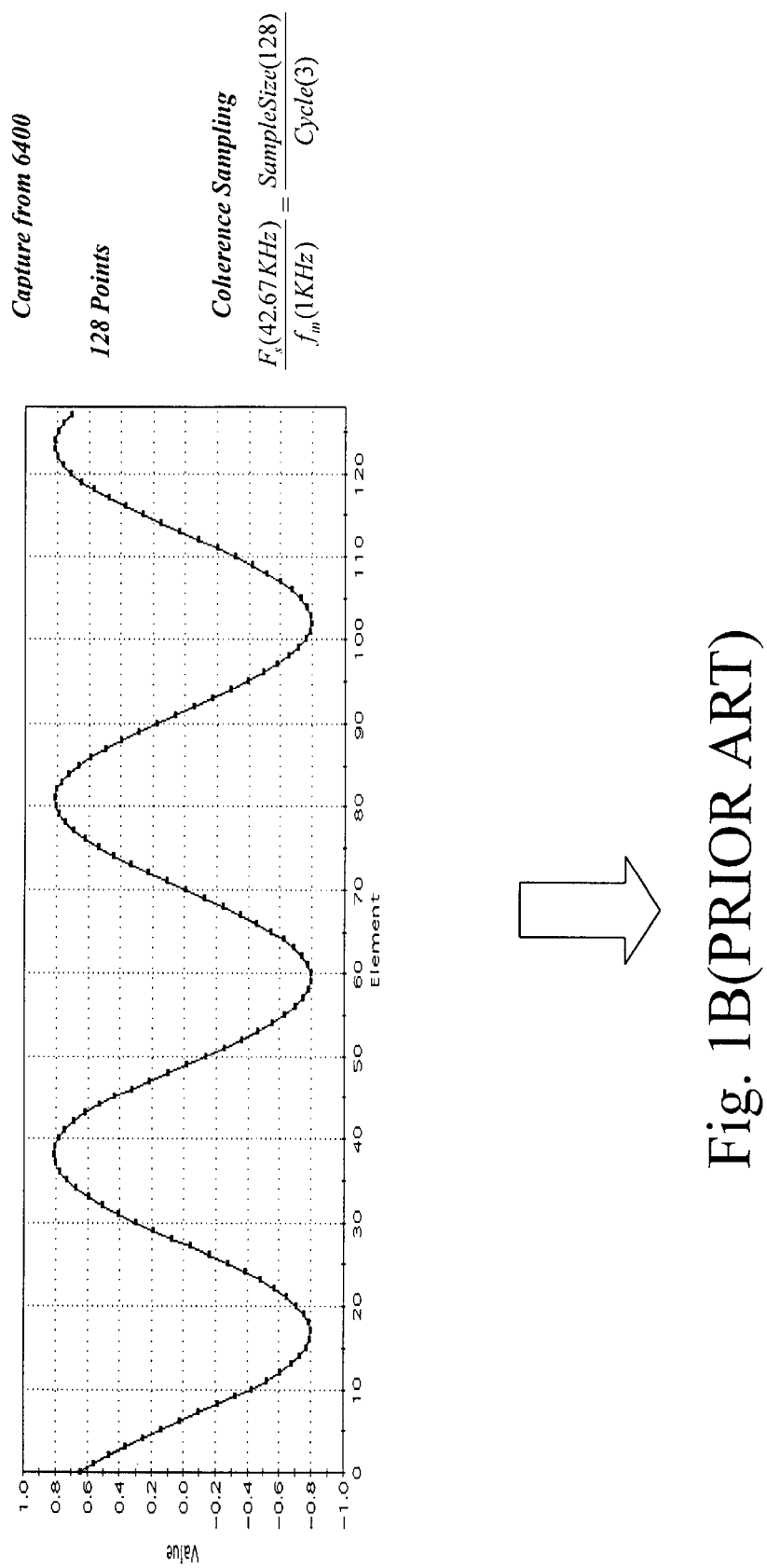
Figure 1C:
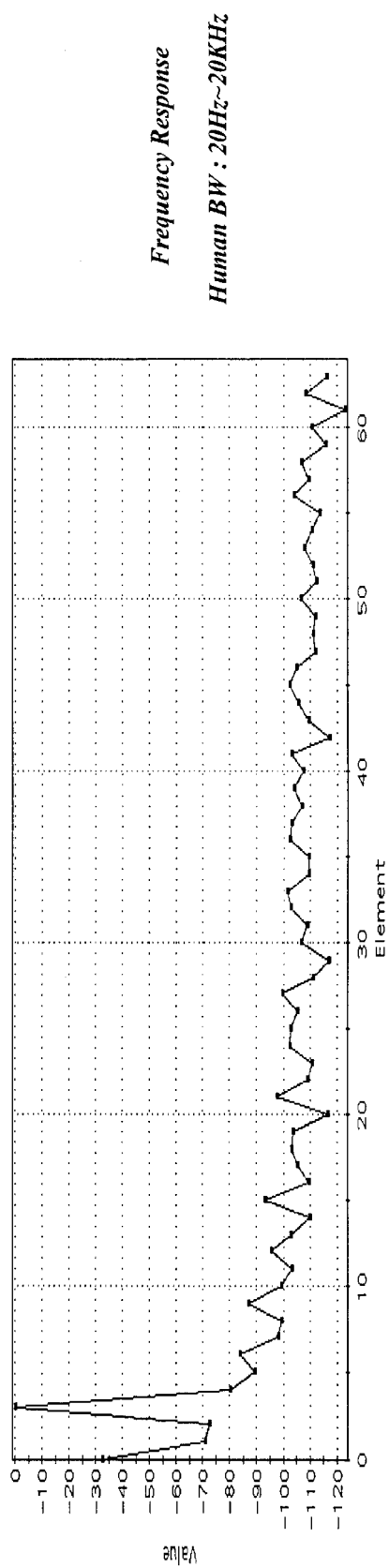
Figure 2A:
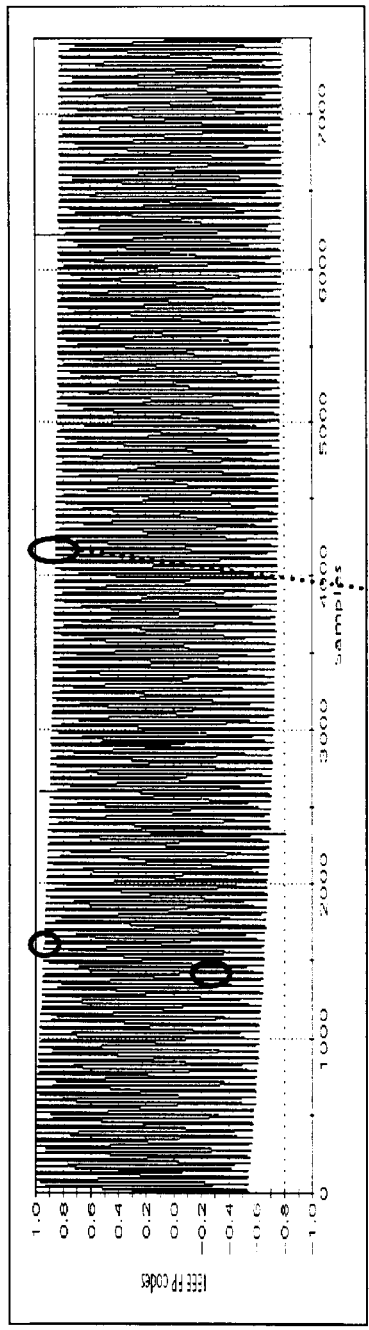
Figure 2B:
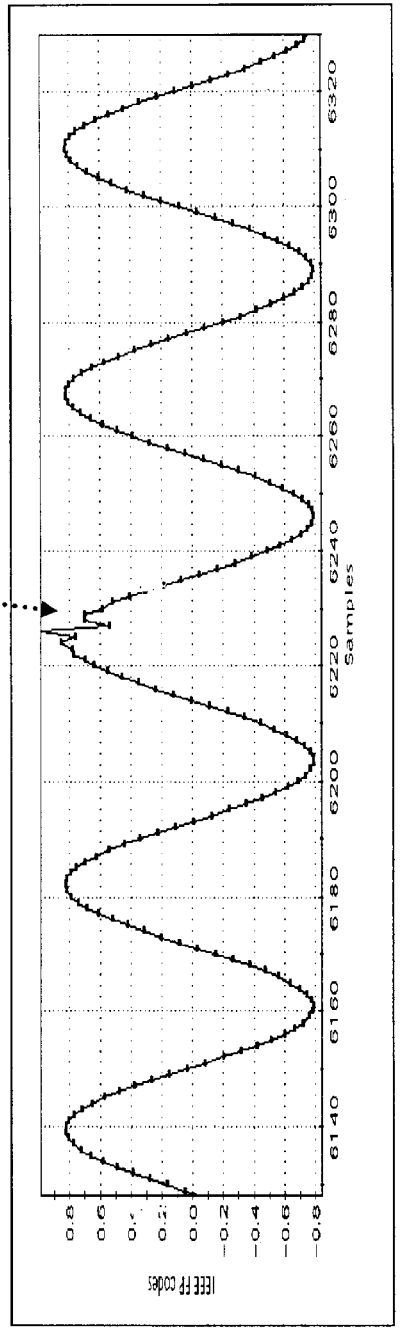
Figure 4A:
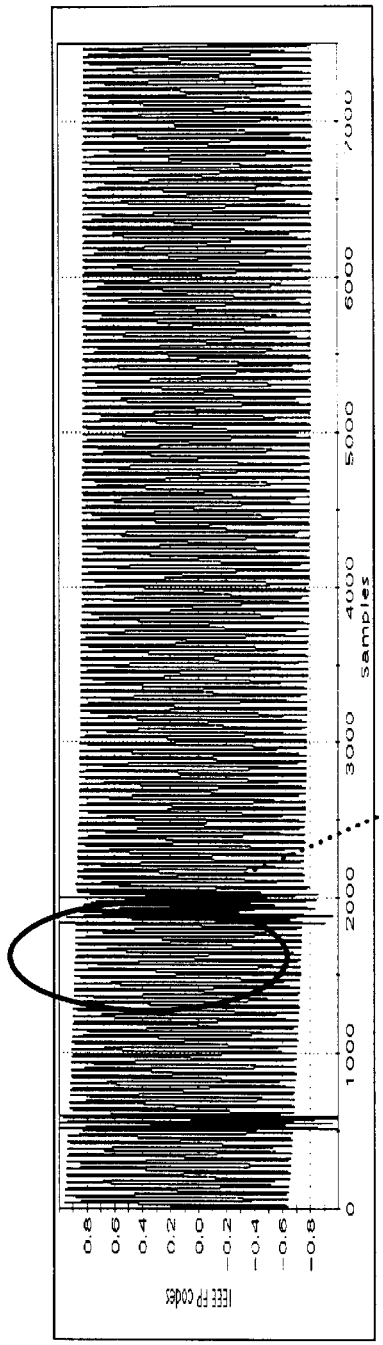
Figure 4B:
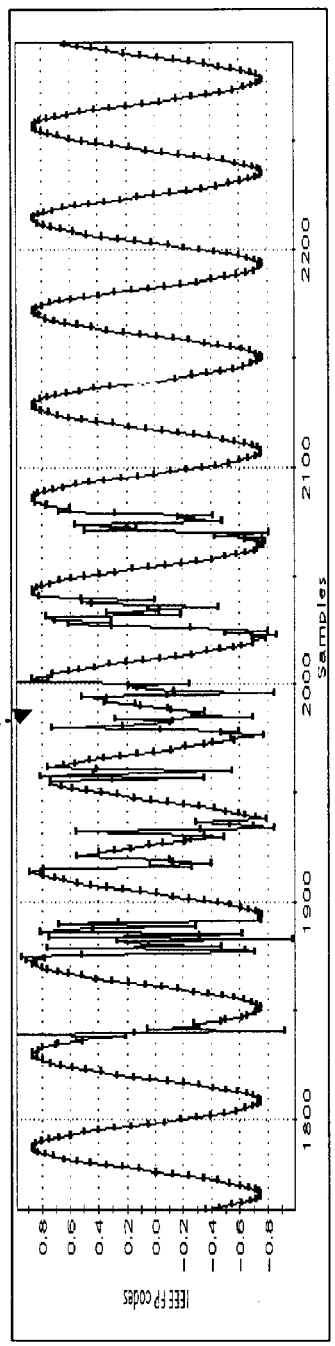
Figure 5:
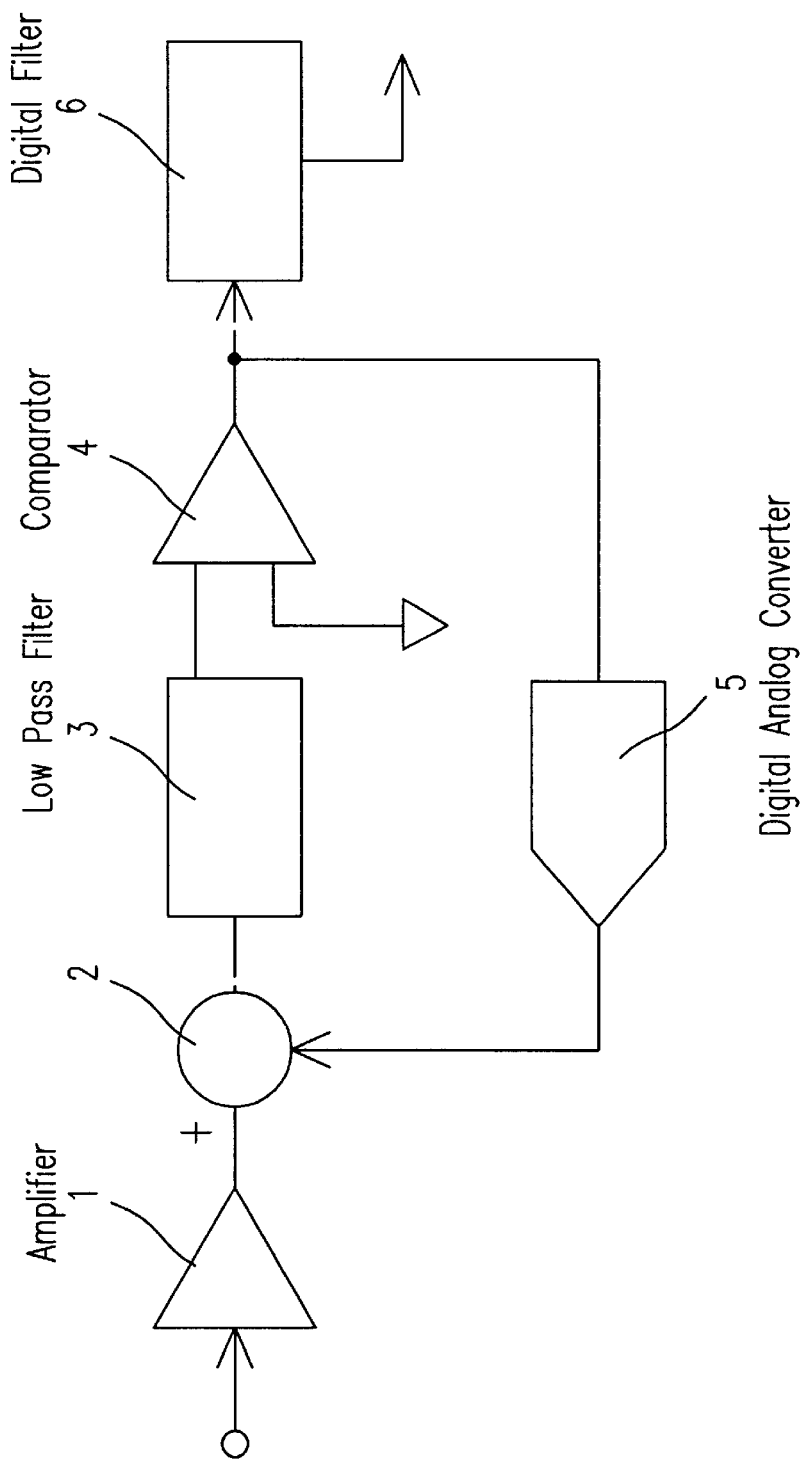
FIG. 5 is a schematic view showing a delta-sigma (ΔΣ) analog digital converter according to a preferred embodiment of the present invention.

FIG. 5 is a diagram showing a delta-sigma (ΔΣ) analog digital converter according to a preferred embodiment of the present invention. The delta-sigma (ΔΣ) analog digital converter includes an amplifier 1, an adder-subtractor 2, a low pass filter 3, a comparator 4, a digital analog converter 5 and a digital filter 6. Moreover, an input end of the amplifier 1 is floating, i.e. not signals are received by the input end, and the adder-subtractor 2 is electrically connected to output ends of the amplifier 1, the comparator 4 and the low pass filter 3, respectively. Also, an input end (+) of the comparator 4 is electrically connected input ends of the low pass filter 3 and the digital filter 6. The digital filter 6 further includes a plurality of multiplier-accumulators (not shown), a delay flip-flop (not shown) and a coefficient register (not shown).

A small input signal is magnified to a larger output power by using the amplifier 1. A signal outputted from the digital analog converter 5 is calculated as a numeral signal by the adder-subtractor 2, and the numeral signal is transmitted to the low pass filter 3. The high frequency is filtered out and the low frequency is allowed to pass through the low pass filter 3. The numeral signal outputted from the low pass filter 3 is compared by the comparator 4. When the value of the modulated signal modulated by a 1-bit modulator (not shown) is other than 0 and 1, the modulated signal is outputted to the digital analog converter 5, and is farther calculated by the adder-subtractor 2. After repeating the foresaid process, when the value of the modulated signal is 0 or 1, the modulated signal is transmitted to the digital filter 6. Then, the random missing code is determined by the plurality of multiplier-accumulators, the delay flip-flop and the coefficient register in the digital filter 6.

The present invention is primarily characterized in that the input end of the delta-sigma ($\Delta\Sigma$) analog digital converter is floated. In the condition that the input end receives no signals, the value of the signal outputted from the comparator 4 to the digital filter 6 is 0. When a modulated signal is outputted to the digital filter 6, some coefficients are generated from the serial equations. These coefficients multiplied by Di are output codes, respectively. Therefore, when the input end of the delta-sigma ($\Delta\Sigma$) analog digital converter is floating, the value of modulated signal outputted to the digital filter 6 should be 0. Moreover, the coefficients would be a value of 0, and the coefficients multiplied by Di would be a value of 0. So that the values of the output codes are expectably 0. Consequently, the random missing code exists when the output code is a value other than 0.

Figure 6A:
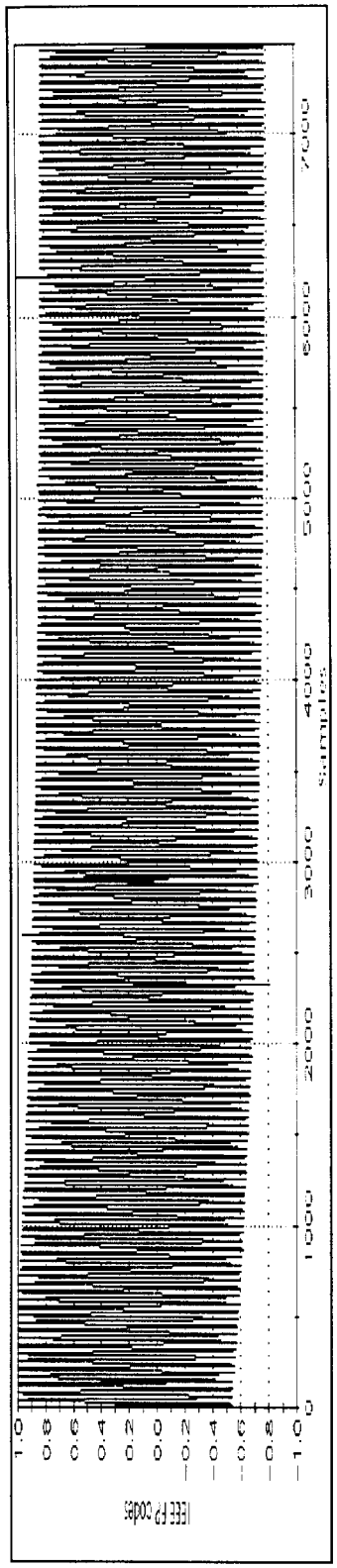
Figure 6B:
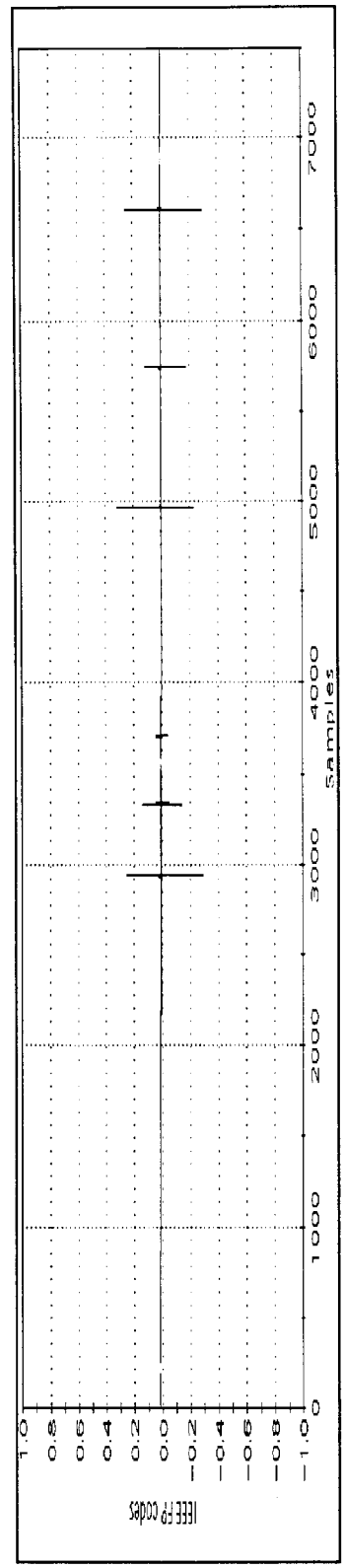
Figure 7A:
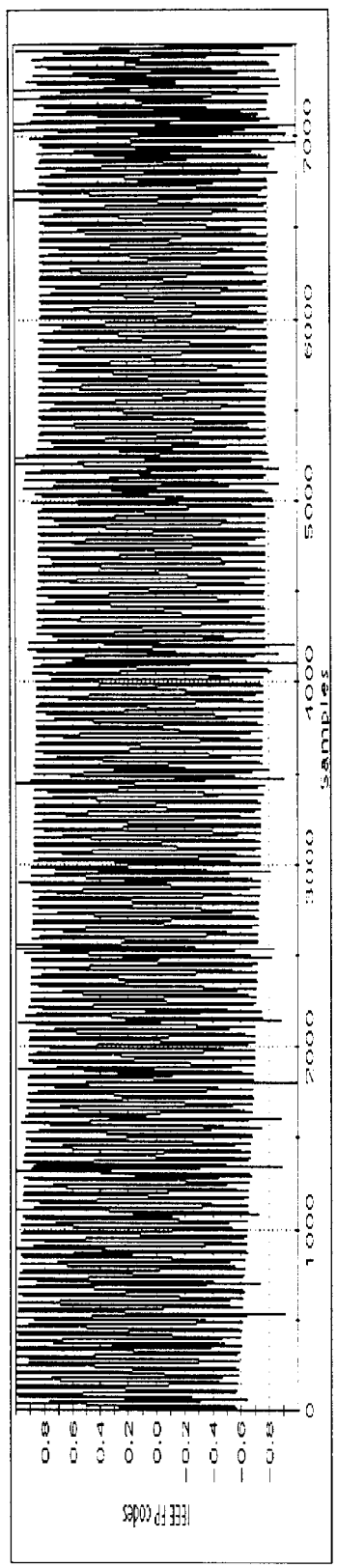
Figure 7B:
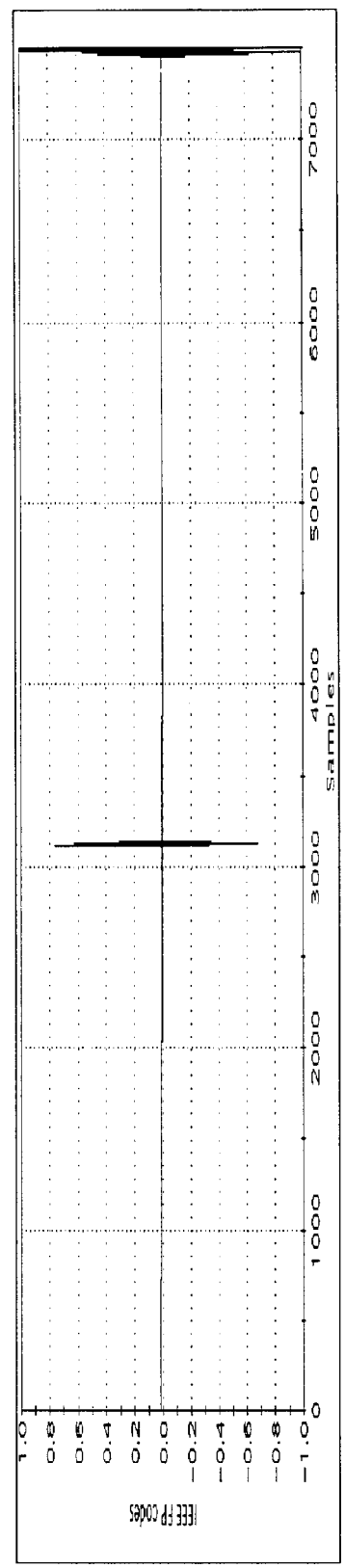

Please refer to FIGS. 6 to 8. FIGS. 6A, 7A and 8A are the signal spectrums measured by a tester according to a preferred embodiment of the present invention. FIGS. 6B, 7B and 8B are diagrams illustrating a random missing code measured by the tester in FIGS. 6A, 7A and 8A. When the random missing code exists, the value of the output code is a digital value other than 0 as shown in FIGS. 6B, 7B and 8B.

Therefore, the conventional method for detecting the random missing code would be improved according to the present invention. It is understood that the method and the detecting device provided by the present invention for detecting a random missing code could be determined in the time domain and be controlled efficiently.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What we claim is:

1. A method for detecting a random missing code by applying a delta-sigma ($\Delta\Sigma$) analog digital converter having a digital filter, comprising steps of:

floating an input end of said delta-sigma ($\Delta\Sigma$) analog digital converter; and detecting an output code outputted from said digital filter of said delta-sigma ($\Delta\Sigma$) analog digital converter for determining whether said random missing code exists.

2. The method according to claim 1, wherein said random missing code is determined in a time domain.

3. The method according to claim 1, wherein said random missing code is determined via an oscilloscope.

4. The method according to claim 1, wherein said random missing code is determined by the value of said output code when floating said input end of said delta-sigma ($\Delta\Sigma$) analog digital converter.

5. The method according to claim 4, wherein said random missing code is determined when the value of said output code is a digital value other than 0.

6. The method according to claim 1, wherein said delta-sigma ($\Delta\Sigma$) analog digital converter further comprises a comparator, a digital analog converter and a low pass filter.

7. The method according to claim 1, wherein said digital filter comprises a plurality of multiplier-accumulators, a delay flip-flop and a coefficient register.

8. A method for detecting a random missing code, comprising steps of:

providing a delta-sigma ($\Delta\Sigma$) analog digital converter;

floating an input end of said delta-sigma ($\Delta\Sigma$) analog digital converter; and detecting an output code outputted from a digital filter of said delta-sigma ($\Delta\Sigma$) analog digital converter for determining whether the value of said output code is a specific digital value other than 0.

9. The method according to claim 8, wherein said random missing code is determined by said specific digital value other than 0.

10. A detecting device for detecting a random missing code, comprising:

an amplifier having an input end and an output end, wherein said input end is floating;

an adder-subtractor electrically connected to said output end of said amplifier;

a low pass filter electrically connected to said adder-subtractor;

a comparator electrically connected to said low pass filter;

a digital analog converter electrically connected to said comparator and said adder-subtractor; and a digital filter electrically connected to said comparator for outputting an output code, thereby determining whether said output code is said random missing code.

11. The detecting device according to claim 10, wherein said digital filter comprises a plurality of multiplier-accumulators, a delay flip-flop and a coefficient register.

12. The method according to claim 10, wherein said random missing code is determined by the value of said output code.

13. The method according to claim 12, wherein said random missing code is determined when the value of said output code is a digital value other than 0.

14. The detecting device according to claim 10, wherein said random missing code is determined in a time domain.

15. The detecting device according to claim 10, wherein said random missing code is determined via an oscilloscope.

* * * * *